US012812811B2

(12) United States Patent
Chiu et al.

(10) Patent No.: US 12,812,811 B2
(45) Date of Patent: Nov. 24, 2026

(54) SUPPORT DEVICE WITH ADJUSTMENT MECHANISM

(71) Applicant: Nan Juen International Co., Ltd., Taoyuan City (TW)

(72) Inventors: I-Hsiang Chiu, Taoyuan City (TW); Jia-Hung Tsai, Taoyuan City (TW); Kuo-Chih Huang, Taoyuan City (TW); Yi-Tian Li, Taoyuan City (TW)

(73) Assignee: Nan Juen International Co., Ltd., Taoyuan City (TW)

( * ) Notice: Subject to any disclaimer, the term of this patent is extended or adjusted under 35 U.S.C. 154(b) by 146 days.

(21) Appl. No.: 18/948,440

(22) Filed: Nov. 14, 2024

(65) Prior Publication Data

US 2026/0107406 A1 Apr. 16, 2026

(30) Foreign Application Priority Data

Oct. 14, 2024 (TW) ................................ 113139127

(51) Int. Cl.
*H05K 7/14* (2006.01)
*H05K 7/18* (2006.01)

(52) U.S. Cl.
CPC ........... *H05K 7/1489* (2013.01); *H05K 7/183* (2013.01)

(58) Field of Classification Search
CPC ........ H05K 7/1489; H05K 7/183; A47F 7/00; G06F 1/16
USPC ........... 312/334.4, 334.5, 334.8; 211/26, 175
See application file for complete search history.

(56) References Cited

U.S. PATENT DOCUMENTS

| | | | | |
|---|---|---|---|---|
| 5,833,337 A * | 11/1998 | Kofstad | H05K 7/1489 | 211/175 |
| 6,230,903 B1 * | 5/2001 | Abbott | A47B 88/43 | 361/829 |
| 6,702,124 B2 * | 3/2004 | Lauchner | H05K 7/1421 | 312/334.44 |
| 9,750,155 B2 * | 8/2017 | Henderson | G06F 1/181 | |
| 10,765,207 B2 * | 9/2020 | Chen | H05K 7/1489 | |
| 11,647,836 B2 * | 5/2023 | Chen | A47B 57/32 | 211/162 |
| 2001/0040203 A1 * | 11/2001 | Brock | H02B 1/34 | 211/192 |
| 2004/0108427 A1 * | 6/2004 | Chen | A47B 88/43 | 312/334.44 |
| 2009/0166485 A1 * | 7/2009 | Chen | A47B 88/43 | 248/200 |

* cited by examiner

*Primary Examiner* — James O Hansen

(57) ABSTRACT

A support device with an adjustment mechanism includes an adapter plate, a front bracket and an adjustment mechanism. The front bracket is displaced relative to the adapter plate, and the adjustment mechanism has an adjustment member, which drives the front bracket to perform rapid displacement and fine-tuning displacement relative to the adapter plate.

9 Claims, 20 Drawing Sheets

SUPPORT DEVICE WITH ADJUSTMENT MECHANISM

BACKGROUND OF THE INVENTION

1. Field of the Invention

The present invention is a support device with adjustment mechanism, especially a support device for an industrial server rack, which uses the adjustment mechanism to move the front bracket relative to the adapter plate.

2. Description of the Related Art

In the existing Open Compute Project (OCP) OCP rack, the conventional installation method is to connect the holes of the OCP rack and one side of the adapter plate through fixing members, and the slide rail assembly is connected to the other side of the adapter plate, or the holes of the OCP rack and one side of the slide rail assembly are connected to each other through fixing members. However, when replacing a slide rail assembly of a different length to be installed on the other side of the adapter plate, it is often necessary to simultaneously replace the adapter plate that matches the length of the slide rail assembly. For example, first remove the adapter plate from the OCP rack, replace the slide rail assembly with different lengths, assemble the replaced slide rail assembly to another matching adapter plate, and then install them together on the OCP rack. This results in increased costs and time-consuming installation. Therefore, how to solve the above-mentioned problems of increased costs and time-consuming installation is the direction that the relevant industries engaged in this industry are eager to study and improve.

SUMMARY OF THE INVENTION

The present invention provides a support device with adjustment mechanism, which comprises an adapter plate having a first end and a second end, a front bracket covering one side of the first end of the adapter plate and displaceable relative to the adapter plate, and an adjustment mechanism. The adjustment mechanism comprises a locking member disposed at the first end of the adapter plate, a supporting member disposed at a front end of the front bracket, and an adjustment member passed through the supporting member to form a pivot connection and then passed through the locking member. The adjustment member comprises an operating portion located at one end thereof and far from the locking member and protruding out of the front bracket. The operating portion is operable for the adjustment member to drive the front bracket to adjust the displacement relative to the adapter plate.

Preferably, the adjustment member further comprises a flat surface located on each of a first two opposite sides of an opposite end thereof opposite to the operating portion relative to the supporting member, and a second guide portion with an arc convex shape located on each of a second two opposite sides of the opposite end thereof opposite to the operating portion relative to the supporting member; the locking member comprises a through hole, two through hole grooves with an arc concave shape respectively located on a first two opposite sides in the through hole in the vertical direction, and two first guide portions respectively located on a second two opposite sides in the through hole in the horizontal direction; the operating portion is forced to rotate, when the second guide portions are butted against the first guide portions, the through hole grooves are aligned with the flat surfaces, and the adjustment member is driven to fine-tune the forward and backward displacement in the locking member through the rotation of the operating portion, and when the first guide portions are aligned with the flat surfaces and the second guide portions are aligned with the through hole grooves, the operating portion drives the adjustment member to quickly move and adjust.

Preferably, the supporting member has a cap assembled on a top thereof, the cap being operable to open or cover the operating portion so that the operating portion is prohibited from being operated when the cap covers the operating portion.

Preferably, the first guide portions and the second guide portions are a thread structure that matches each other.

Preferably, the adapter plate comprises a bent portion protruded on an inner edge surface thereof, and two bent sections extending inward on opposing upper and lower sides thereof, so that when the adjustment member drives the front bracket to move relative to the adapter plate to a folded position, the adjustment member has one end thereof form an extension section away from the locking member, and the extension section is located between the inner edge surface of the adapter plate, the bent portion and the bent sections adjacent thereto to form a limit.

Preferably, the adapter plate is further provided with at least one fixing member, and the at least one fixing member has two ends thereof respectively connected to the two bent sections of the adapter plate, and the at least one fixing member is used for installation on a preset rack.

Preferably, the adapter plate further comprises at least one fastener; the front bracket further comprises at least one rail groove for the at least one fastener to penetrate, so that after the adjustment member drives the front bracket to move relative to the adapter plate, the at least one fastener is forced to lock, so that the front bracket is locked relative to the adapter plate.

Preferably, the support device with adjustment mechanism further comprises a first mounting member mounted at the second end of the adapter plate, and a second mounting member mounted at the front bracket far away from the first end of the adapter plate and connected to another mounting member. The first mounting member and the second mounting member are used to assemble a preset slide rail assembly.

Preferably, the adjustment member comprises a joint portion located at one end thereof away from the supporting member and assembled with the operating portion. The joint portion is provided with a second receiving groove, a recessed groove, a first engaging groove and a second engaging groove. The second receiving groove is recessed in an end surface of the adjustment member away from the supporting member. The recessed groove extends from the end surface of the adjustment member toward the supporting member. The first engaging groove is located on the recessed groove toward one side of the supporting member. The first engaging groove surrounds and is recessed on the surface of one end of the adjustment member. The second engaging groove extends from the first engaging groove toward the supporting member. The operating portion is provided with a first receiving groove, a spring pin and a locking portion. The first receiving groove is recessed in the operating portion. The locking portion is convexly disposed on a surface of the first receiving groove. The spring pin is tightly arranged in the operating portion. The adjustment mechanism further comprises an elastic member. The elastic member has two opposite ends thereof placed in the first receiving groove and the second receiving groove respectively.

Preferably, when the operating portion is in a first state relative to the joint portion, the operating portion applies force to rotate relative to the joint portion, and the locking portion is located in the first engaging groove and rotates flexibly. When the first state is switched to a second state, a force is applied to the operating portion to press the joint portion, at this time, the elastic member is elastically deformed, the spring pin enters the recessed groove, and the locking portion enters the second engaging groove from the first engaging groove, and a force is applied to the operating portion again, so that the spring pin abuts against the recessed groove to rotate the joint portion, and the adjustment member is fine-tuned in the forward and backward displacement in the locking member. When the operating portion stops pressing toward the joint portion to return to the first state, the elastic member is elastically reset, the spring pin is disengaged from the recessed groove, and the locking portion enters the first engaging groove from the second engaging groove.

DETAILED DESCRIPTION OF THE PREFERRED EMBODIMENT

Figure 1:
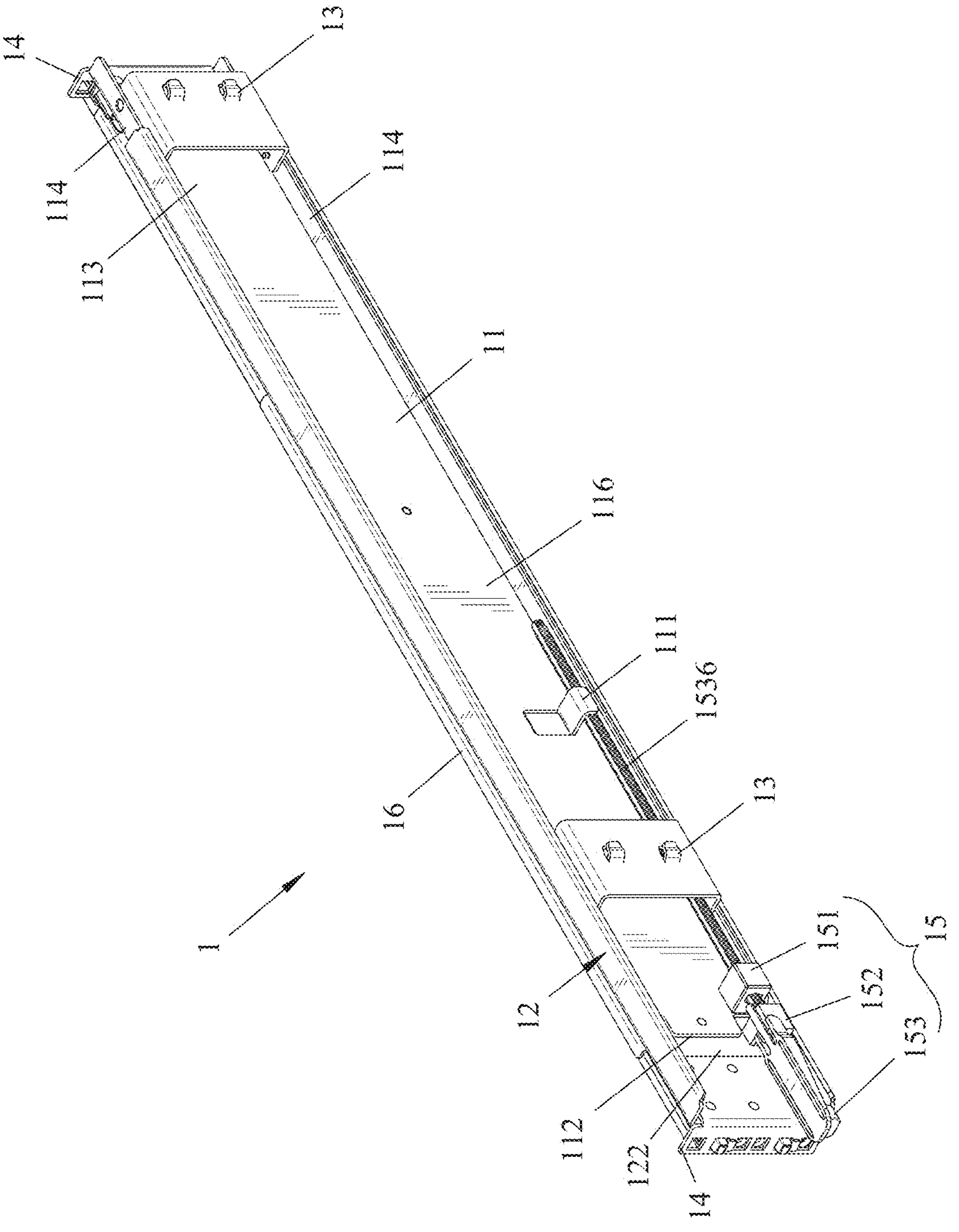
FIG. 1 is a three-dimensional schematic diagram of a support device of the present invention.
Figure 2:
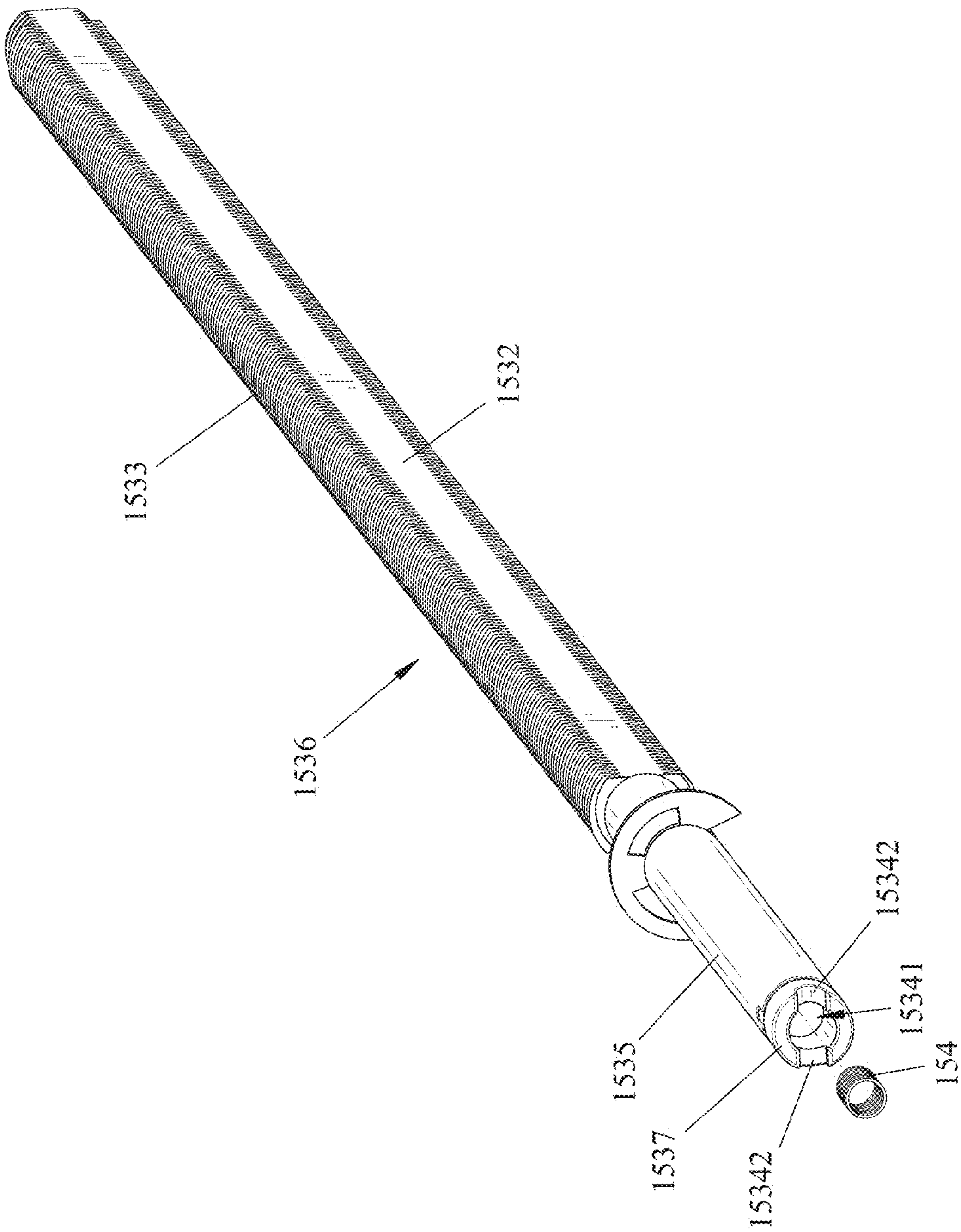
FIG. 2 is a schematic diagram of the adjustment member and the elastic member of the present invention.
Figure 3:
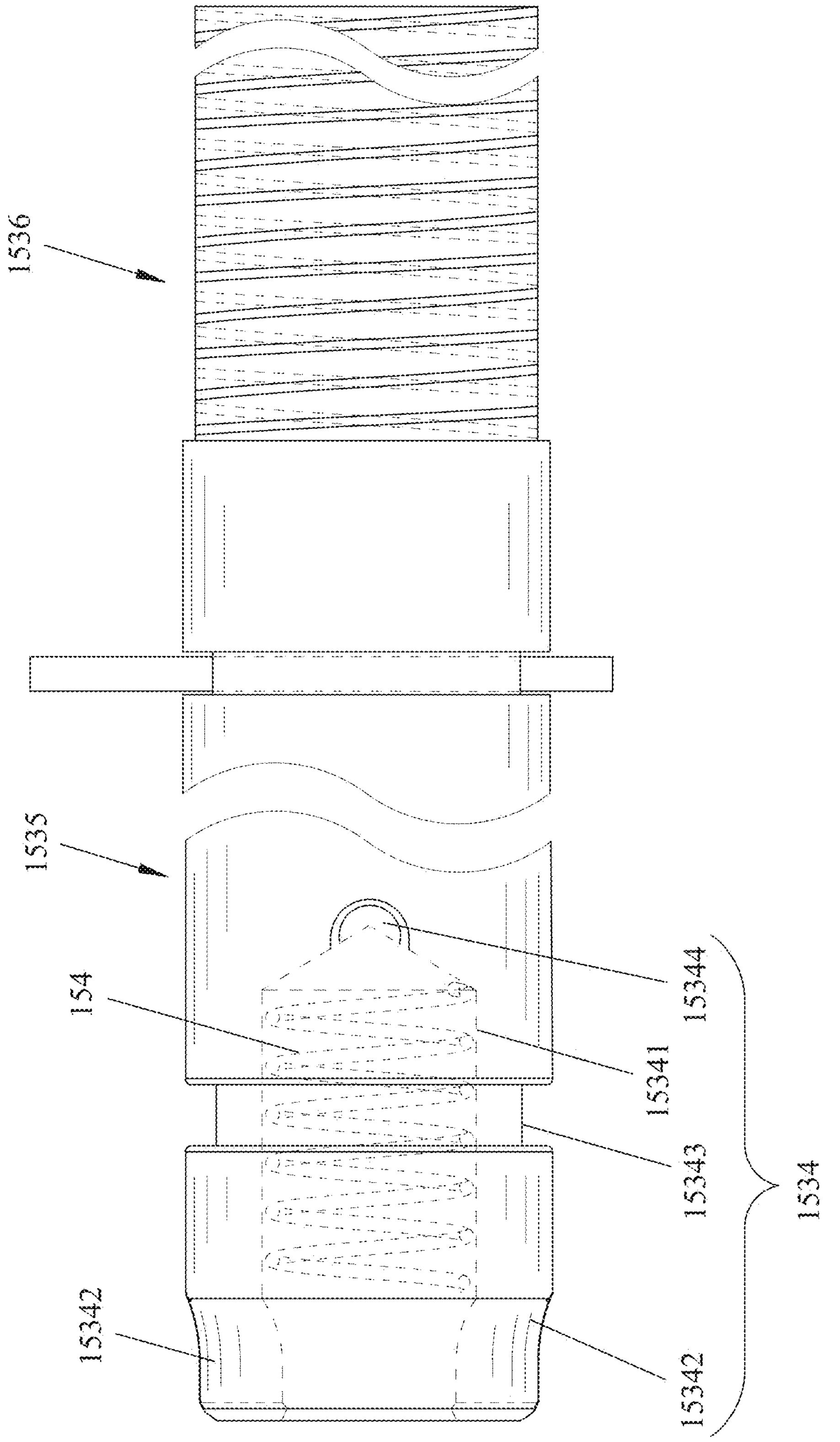
FIG. 3 is a schematic diagram showing the elastic member of the present invention located at the first receiving groove and the second receiving groove.
Figure 4:
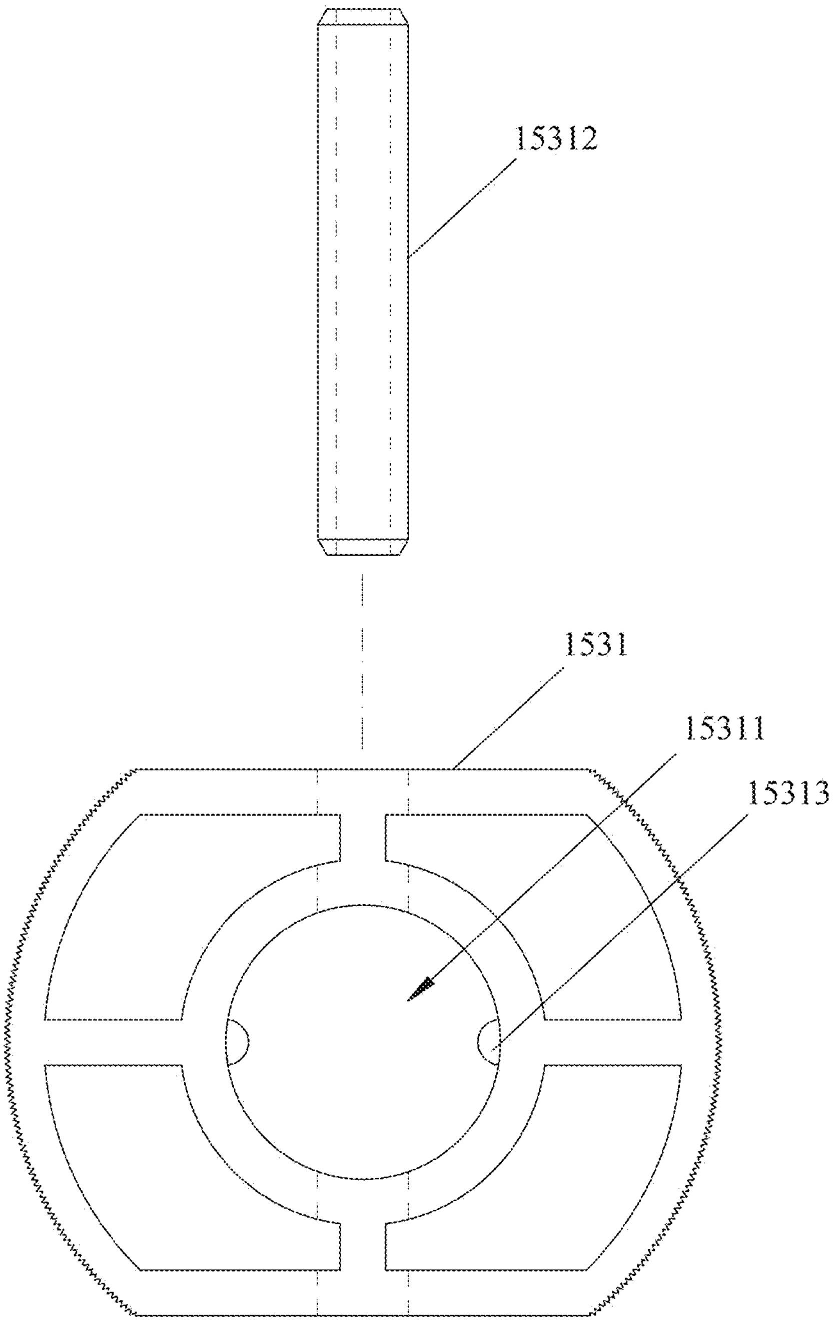
FIG. 4 is a schematic diagram of the operating portion of the present invention.
Figure 5:
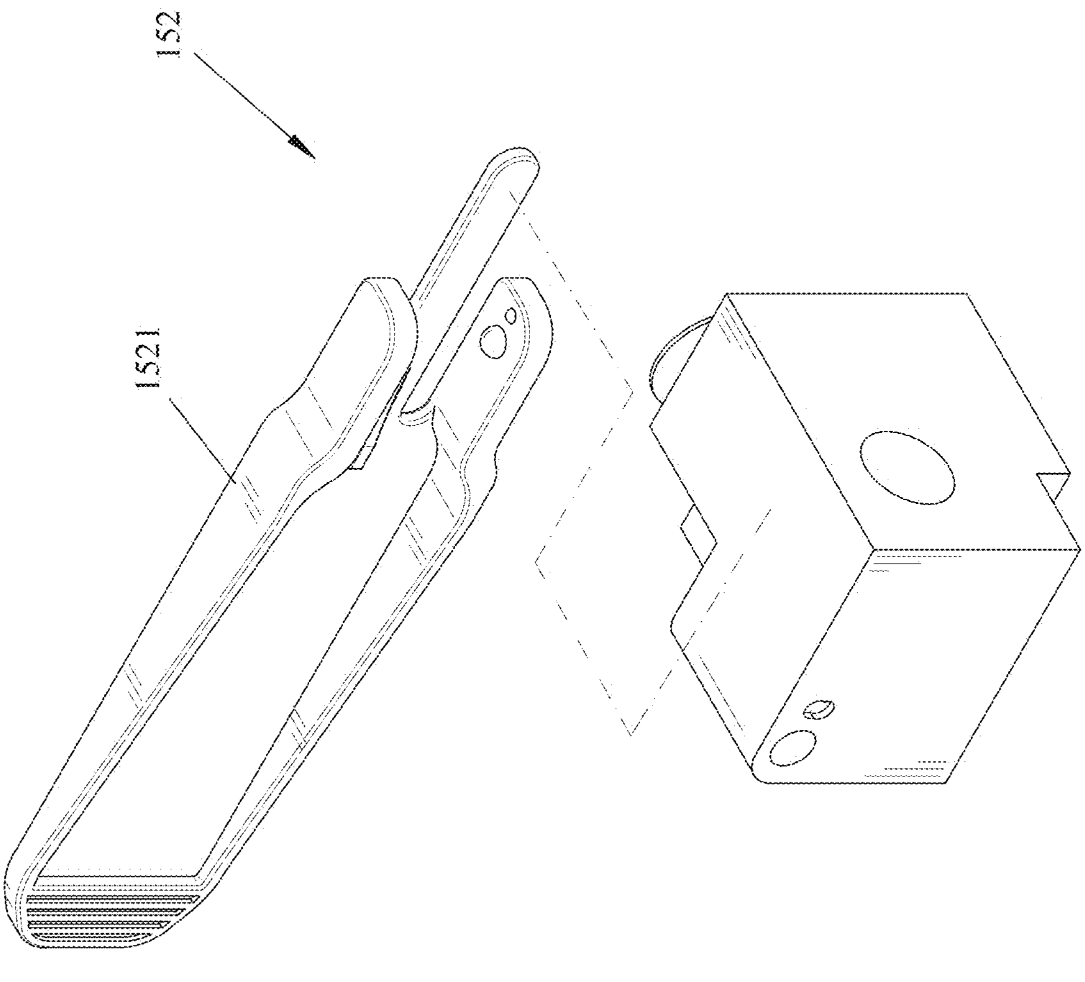
FIG. 5 is a schematic diagram of the cap of the supporting member of the present invention.
Figure 6:
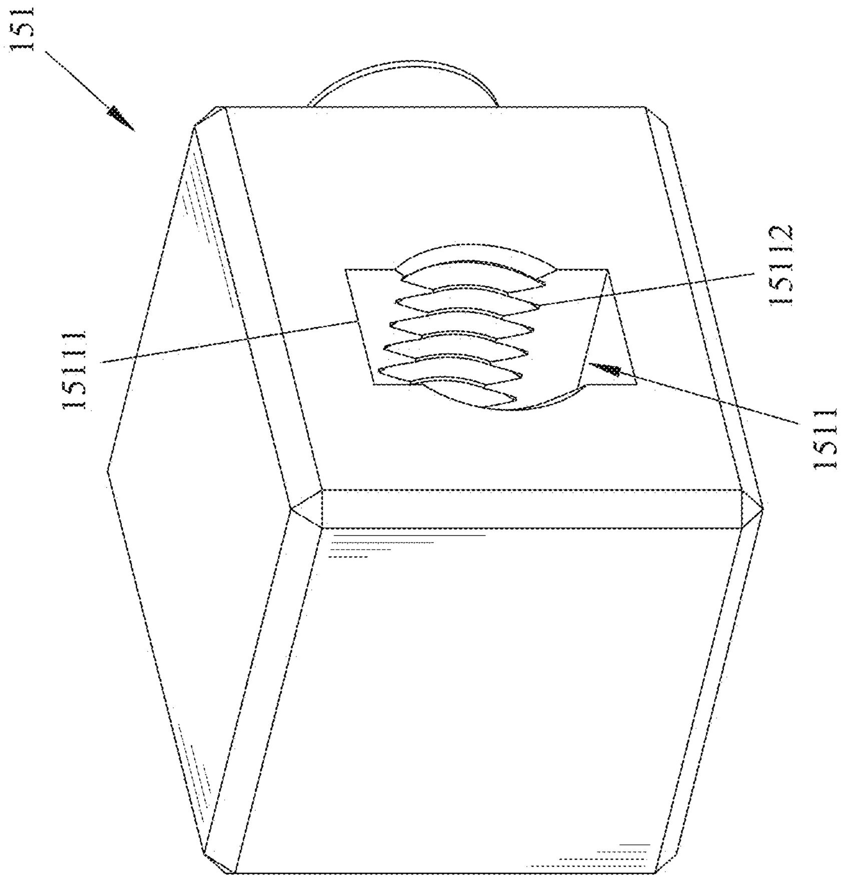
FIG. 6 is a three-dimensional schematic diagram of the locking member of the present invention.
Figure 19:
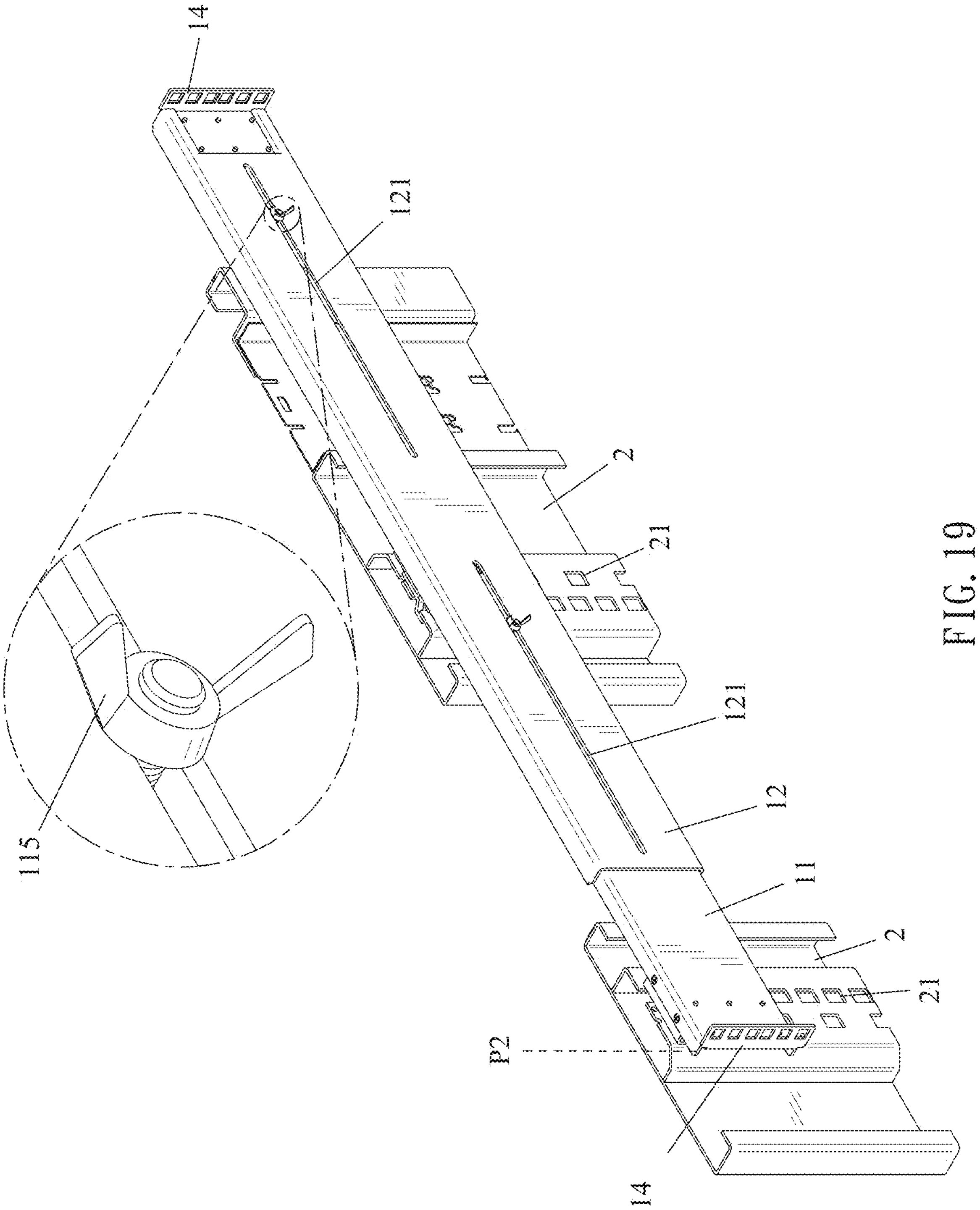
FIG. 19 is a schematic diagram showing the adapter plate of the present invention being locked by two fasteners.

Please refer to FIGS. 1 and 19, the present invention is a support device with adjustment mechanism 1, comprising: an adapter plate 11, a front bracket 12, at least one fixing member 13, two mounting members 14 and an adjustment mechanism 15. A bent portion 111 is protruded on the inner edge surface 116 of the adapter plate 11. The two ends of the adapter plate 11 respectively have a first end 112 and a second end 113. The upper and lower sides of the adapter plate 11 have two bent sections 114 extending inward. The adapter plate 11 is provided with at least one fastener 115. The second end 113 is connected to one mounting member 14. The two bent sections 114 are connected to the at least one fixing member 13. The at least one fixing member 13 has two ends connected to the two bent sections 114 respectively. The front bracket 12 covers the first end 112 of the adapter plate 11. The part of the front bracket 12 that is far away from the first end 112 of the adapter plate 11 is connected to the other mounting member 14. The two mounting member 14 are used to assemble a slide rail assembly 16. The front bracket 12 has at least one rail groove 121 through which at least one fastener 115 is inserted. The at least one fastener 115 is relatively displaced in at least one rail groove 121. The support device 1 is docked and positioned in a preset rack 2. The preset rack 2 has a rack hole 21. The at least one fixing member 13 is located between the adapter plate 11 and rack 2. The adapter plate 11 is mounted on the rack hole 21 through the at least one fixing member 13. The slide rail assembly 16 may be composed of a first rail, a second rail and a third rail. Its structure, displacement, expansion and retraction are already known in the art and will not be further described for the sake of brevity.

The present invention is described by taking the two bent portions 111 integrally formed on the adapter plate 11 as an example. The two bent portions 111 may be integrally formed on the adapter plate 11 (for example, by stamping), or may be separately formed and then assembled on the adapter plate 11. The example is not intended to limit the patent scope of the present invention.

The present invention is described with two fixing members 13, two fasteners 115 and two rail grooves 121 as an example. The number of the fixing members 13, the fasteners 115 and the rail grooves 121 can be three, four or five. The example is not intended to limit the patent scope of the present invention.

Please refer to FIG. 1 to FIG. 6, in which the adjustment mechanism 15 comprises: a locking member 151, a supporting member 152, an adjustment member 153 and an elastic member 154. The locking member 151 is disposed at the first end 112 of the adapter plate 11. The supporting member 152 is disposed at a front end 122 of the front bracket 12, and a cap 1521 is assembled at the top end of the supporting member 152. The adjustment member 153 passes through the supporting member 152 to form a pivot connection, and then passes through the locking member 151. The end 1535 of the adjustment member 153 away from the locking member 151 has an operating portion 1531 protruding from the front bracket 12, and the end 1535 of the adjustment member 153 away from the supporting member 152 has a joint portion 1534 assembled with the operating portion 1531. The elastic member 154 is accommodated between the operating portion 1531 and the joint portion 1534.

Please refer to FIGS. 2 to 7, where the operating portion 1531 is provided with a first receiving groove 15311, a spring pin 15312 and a locking portion 15313. The first receiving groove 15311 is recessed in the operating portion 1531. The locking portion 15313 is convexly disposed on the surface of the first receiving groove 15311. The spring pin 15312 is tightly arranged in the operating portion 1531, and the spring pin 15312 and the locking portion 15313 are misaligned. The joint portion 1534 has a second receiving groove 15341, a recessed groove 15342, a first engaging groove 15343 and a second engaging groove 15344. The second receiving groove 15341 is recessed in an end surface 1537 of the adjustment member 153 away from the supporting member 152. The two ends of the elastic member 154 are placed in the first receiving groove 15311 and the second receiving groove 15341 respectively. The recessed groove 15342 extends from the adjustment member end surface 1537 toward the supporting member 152. The first engaging groove 15343 is located on the recessed groove 15342 toward one side 1522 of the supporting member 152. The first engaging groove 15343 surrounds and is recessed on the surface of one end 1535 of the adjustment member 153. The second engaging groove 15344 extends from the first engaging groove 15343 toward the supporting member 152.

Figure 7:
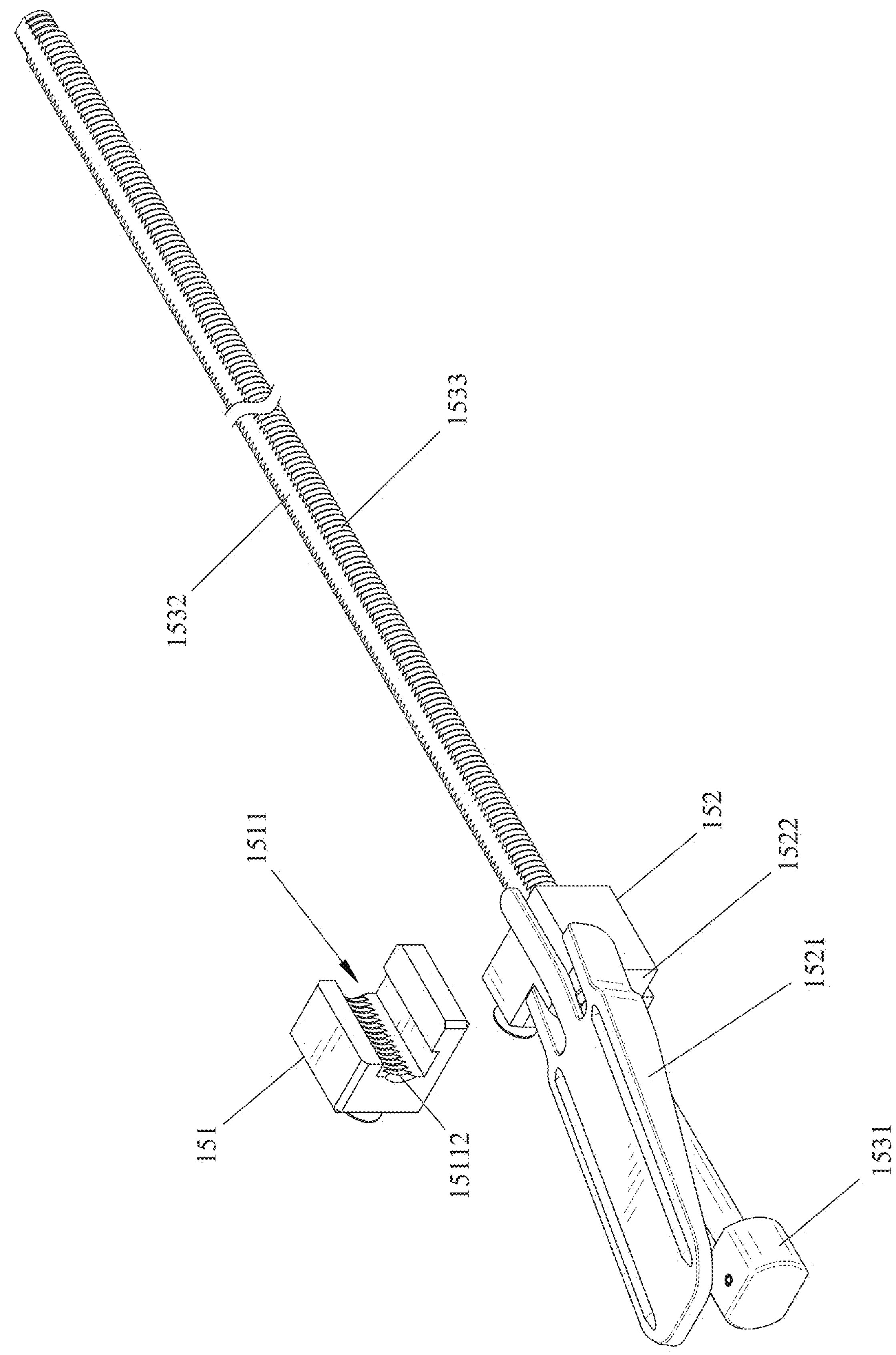
FIG. 7 is a partial cross-sectional view of the locking member of the present invention.
Figure 8:
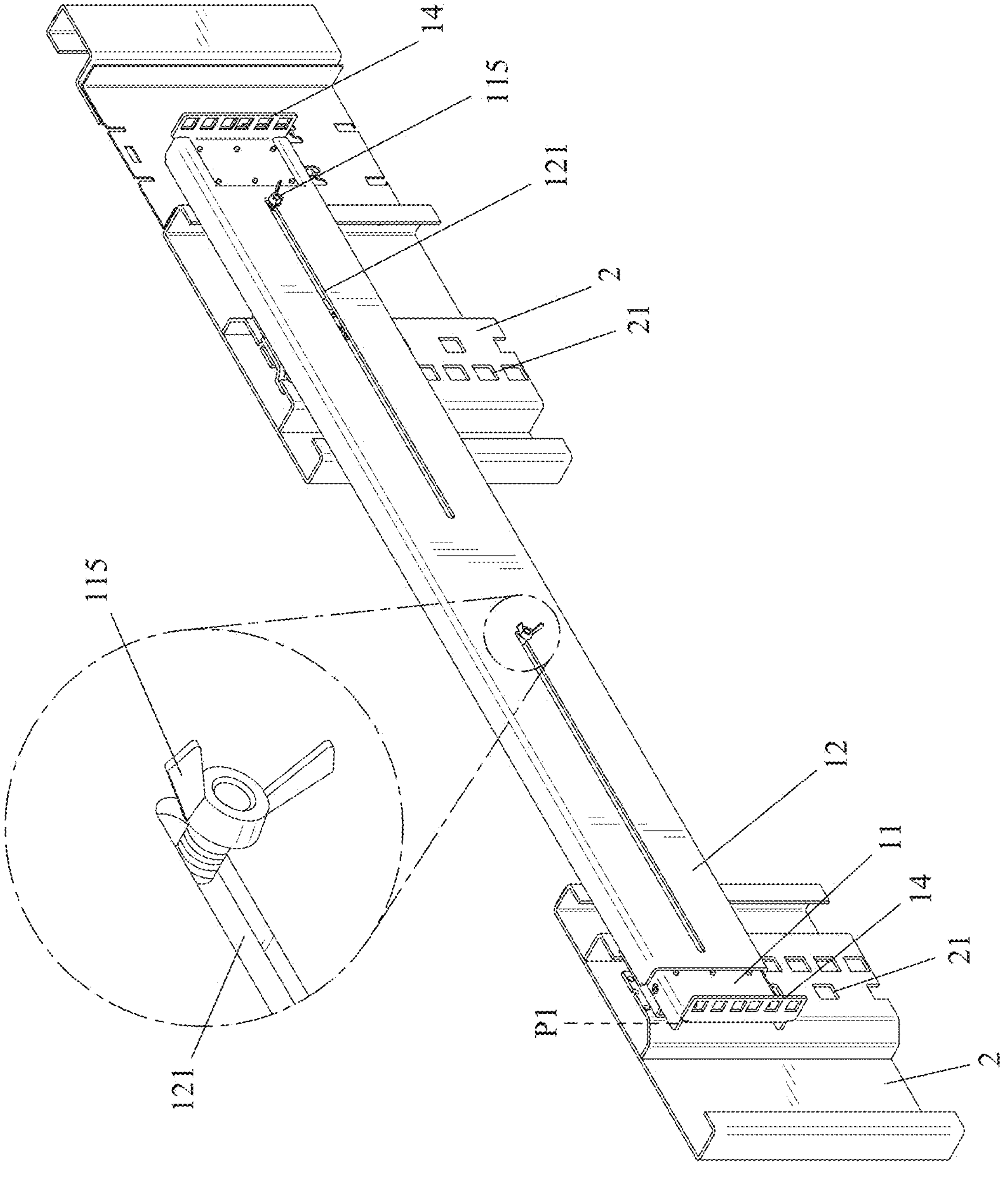
FIG. 8 is a schematic diagram showing that the two fasteners of the adapter plate of the present invention are loose.
Figure 9:
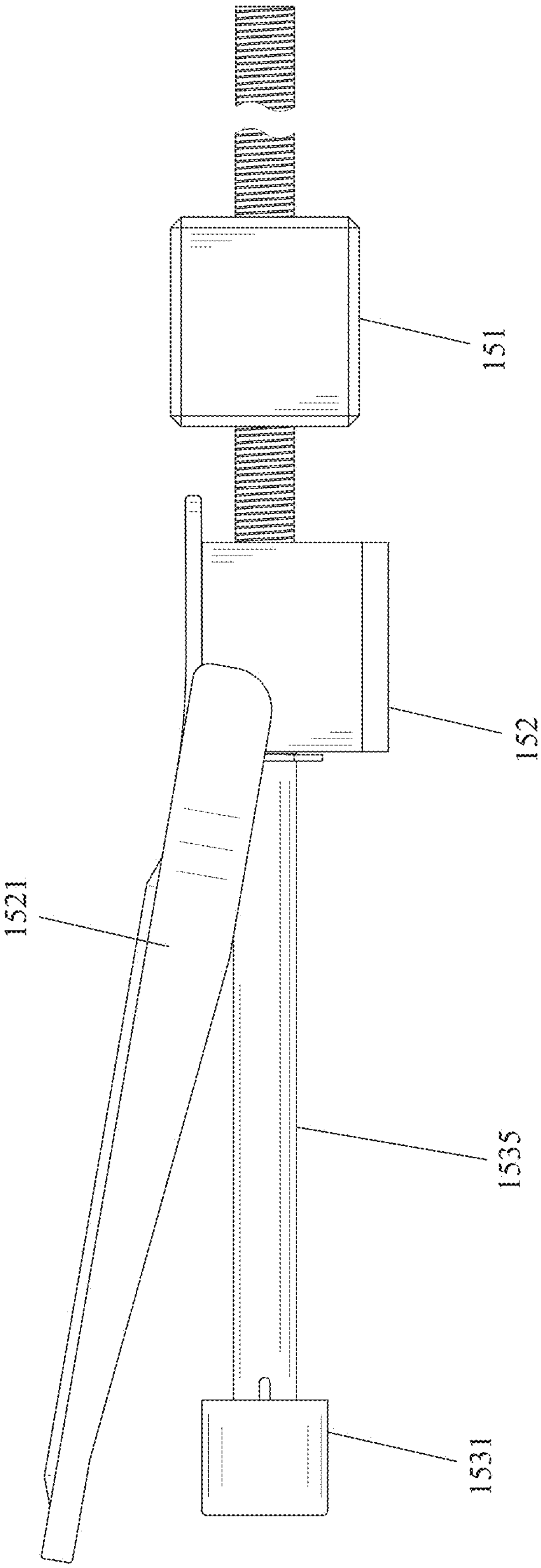
FIG. 9 is a schematic diagram showing the cap of the supporting member of the present invention being opened when applying force.

Referring to FIG. 7, the adjustment member 153 has a flat surface 1532 on each of two opposite sides at the other end 1536 thereof opposite to the operating portion 1531 relative to the supporting member 152, and the adjustment member 153 has a second guide portion 1533 on each of two other opposite sides at the said other end 1536 opposite to the operating portion 1531 relative to the supporting member 152. The locking member 151 has a through hole 1511, two opposite sides of the through hole 1511 have through hole grooves 15111, and the other two opposite sides of the through hole 1511 have first guide portions 15112. The first guide portions 15112 and the second guide portions 1533 are respectively thread structures that match each other.

Please refer to FIG. 1 and FIG. 8 to FIG. 19, where the two ends of the slide rail assembly 16 are respectively connected to the mounting member 14 at the front bracket 12 and the other mounting member 14 at the adapter plate 11, firstly, the two fasteners 115 are loosened to release the front bracket 12 relative to the adapter plate 11. Then, force is applied to the cap 1521 covering the operating portion 1531, so that the cap 1521 is opened to expose the operating portion 1531. At this time, a force is applied to the operating portion 1531, and the operating portion 1531 switches from a first state S1 to a second state S2 relative to the joint portion 1534, the first guide portion 15112 and the second guide portion 1533 are released from docking, the first guide portions 15112 are aligned with the flat surfaces 1532, and the second guide portions 1533 are aligned with the through hole grooves 15111. At this time, a force is applied to the operating portion 1531 to move in the first direction D1, and the operating portion 1531 switches from the second state S2 to the first state S1 relative to the joint portion 1534, so that the adjustment member 153 drives the front bracket 12 to quickly move relative to the adapter plate 11 from a retracted position P1 to a predetermined position P2. After the adjustment is completed, the operating portion 1531 is forced to rotate again. The operating portion 1531 switches from the first state S1 to the second state S2 relative to the joint portion 1534, so that the first guide portions 15112 are aligned with the second guide portions 1533, and the flat surfaces 1532 are aligned with the through hole grooves 15111. The operating portion 1531 can be rotated to drive the adjustment member 153 to fine-tune the forward and backward displacement of the locking member 151. After the displacement fine adjustment is completed, and the operating portion 1531 switches from the second state S2 to the first state S1 relative to the joint portion 1534, a force is applied to the cap 1521, so that the cap 1521 covers the operating portion 1531, and the operating portion 1531 cannot be rotated to drive the adjustment member 153 to move forward and backward in the locking member 151 for fine adjustment of displacement. Finally, force is applied to the two fasteners 115 to lock them (the order of applying force to the two fasteners 115 and the cap 1521 can be interchanged), so that the front bracket 12 is locked relative to the adapter plate 11.

Figure 10:
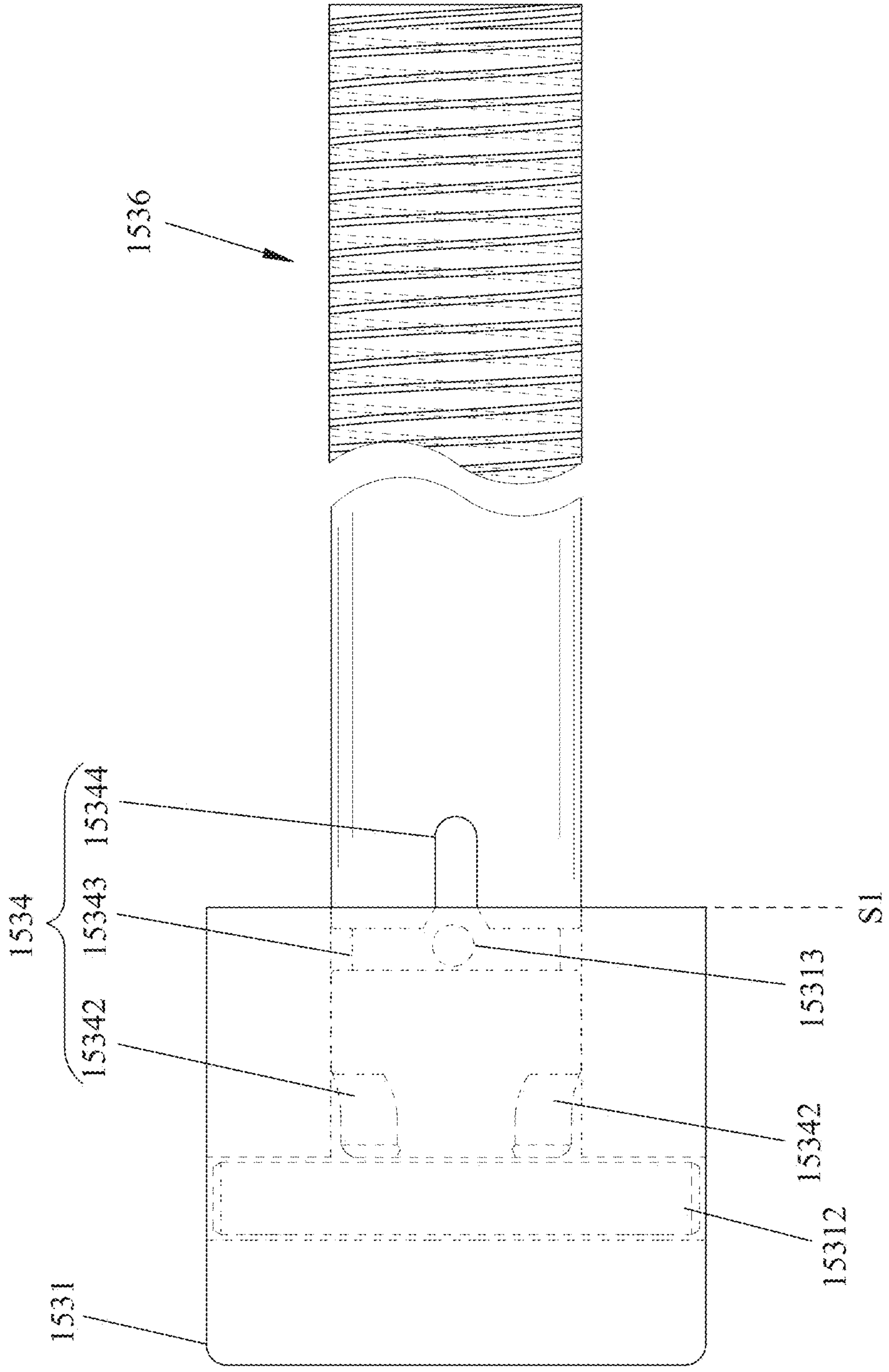
FIG. 10 is a schematic diagram showing the operating portion of the present invention in a first state relative to the joint portion.
Figure 11:
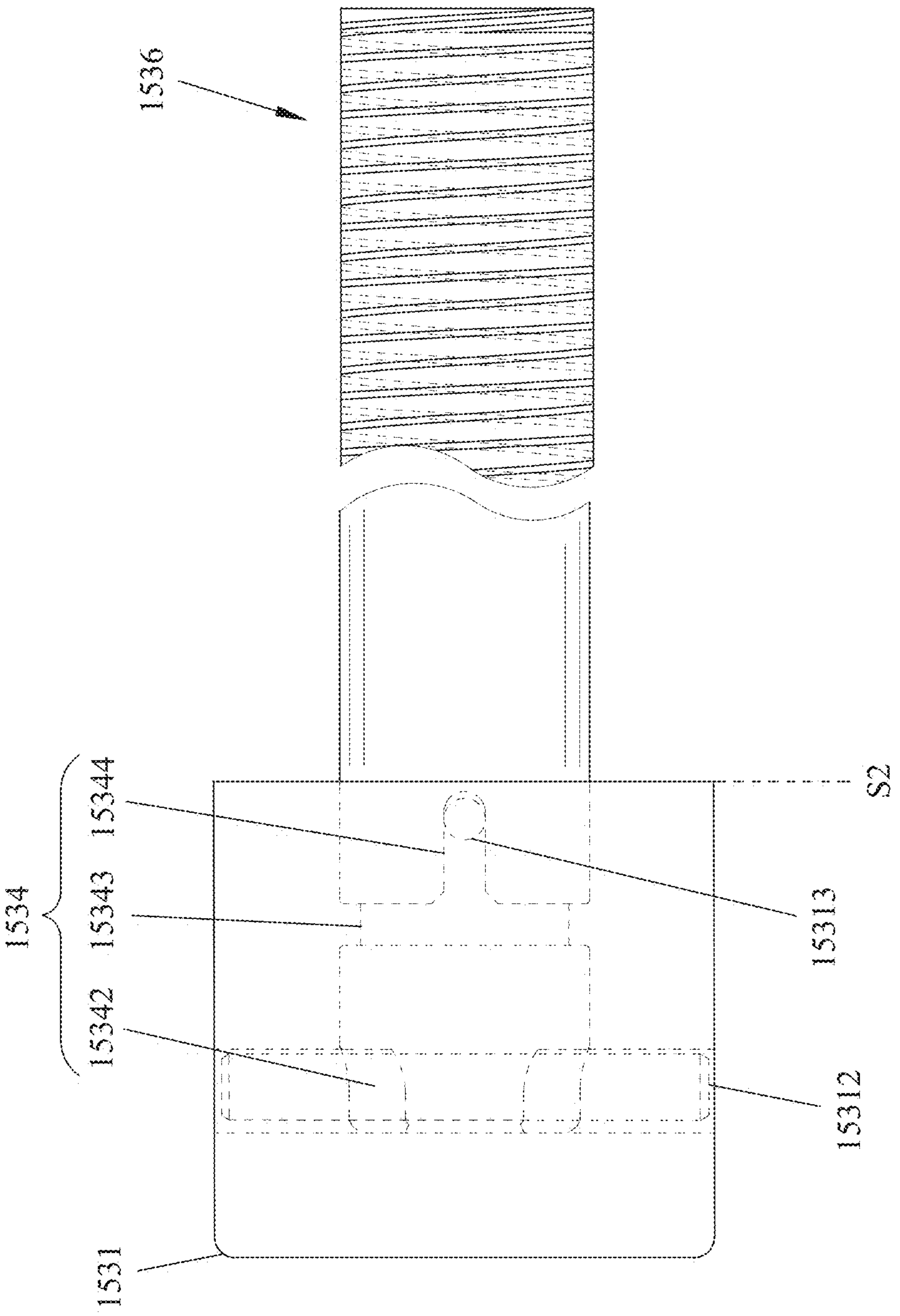
FIG. 11 is a schematic diagram showing the operating portion of the present invention in a second state relative to the joint portion.
Figure 12:
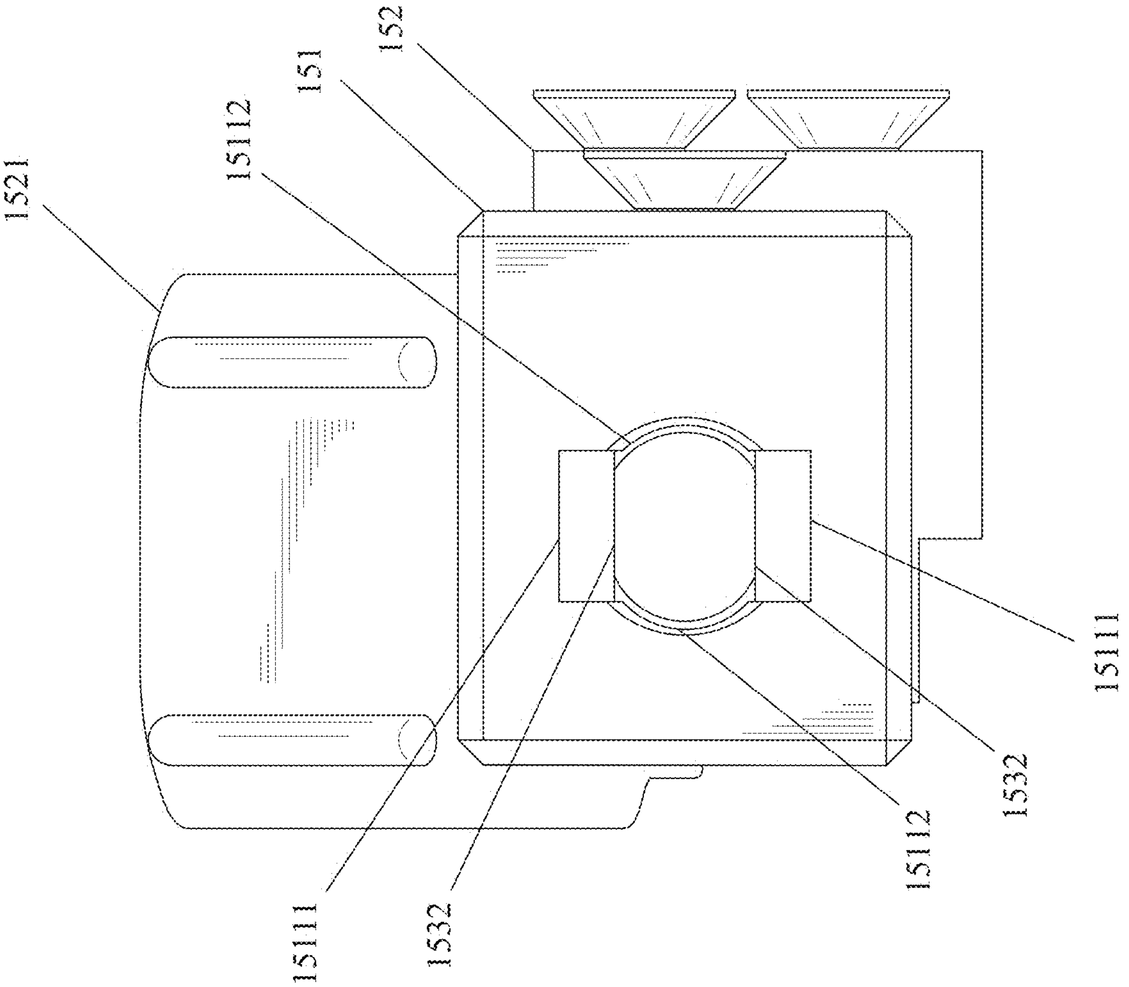
FIG. 12 is a schematic diagram of the first guide portion docking with the second guide portion of the present invention.
Figure 13:
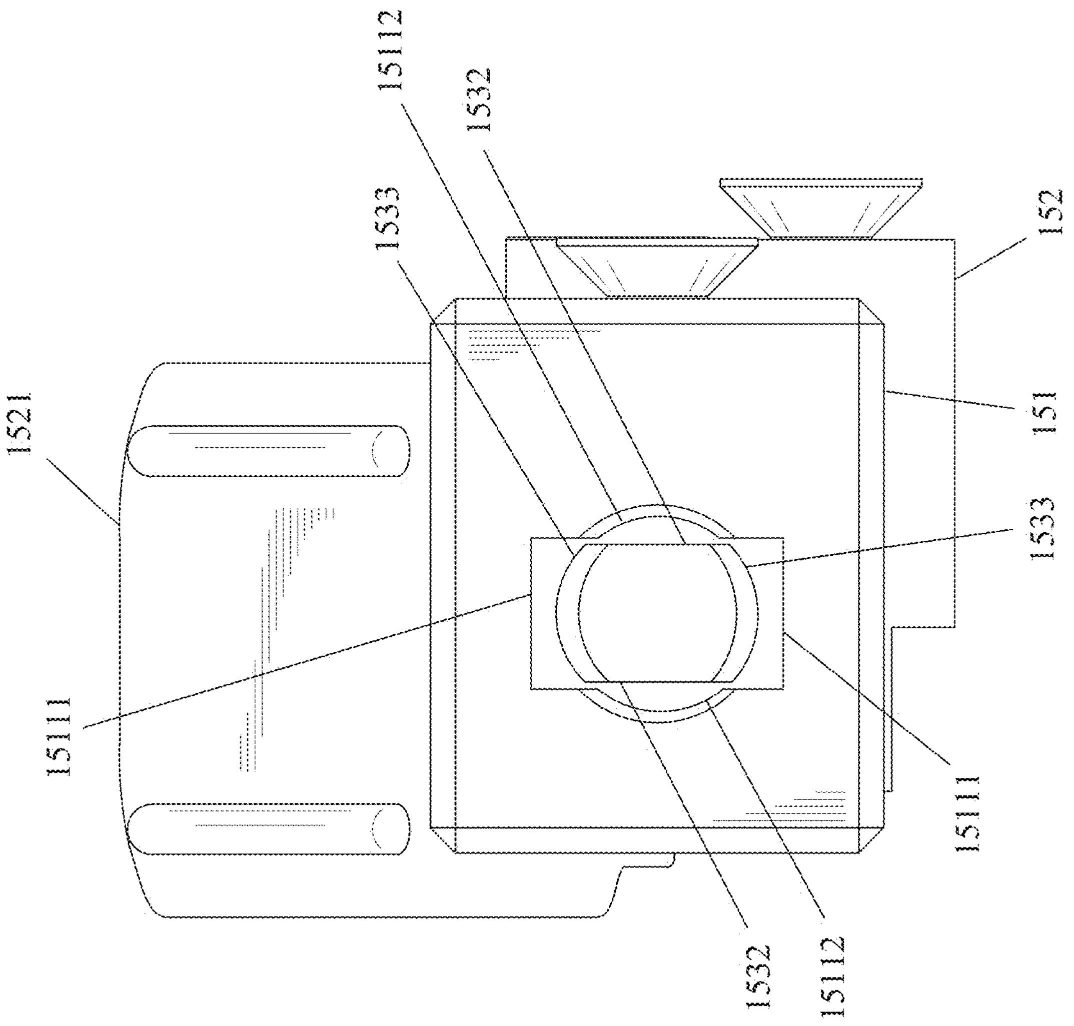
FIG. 13 is a schematic diagram of the first guide portion of the present invention aligned with the flat surface.
Figure 14:
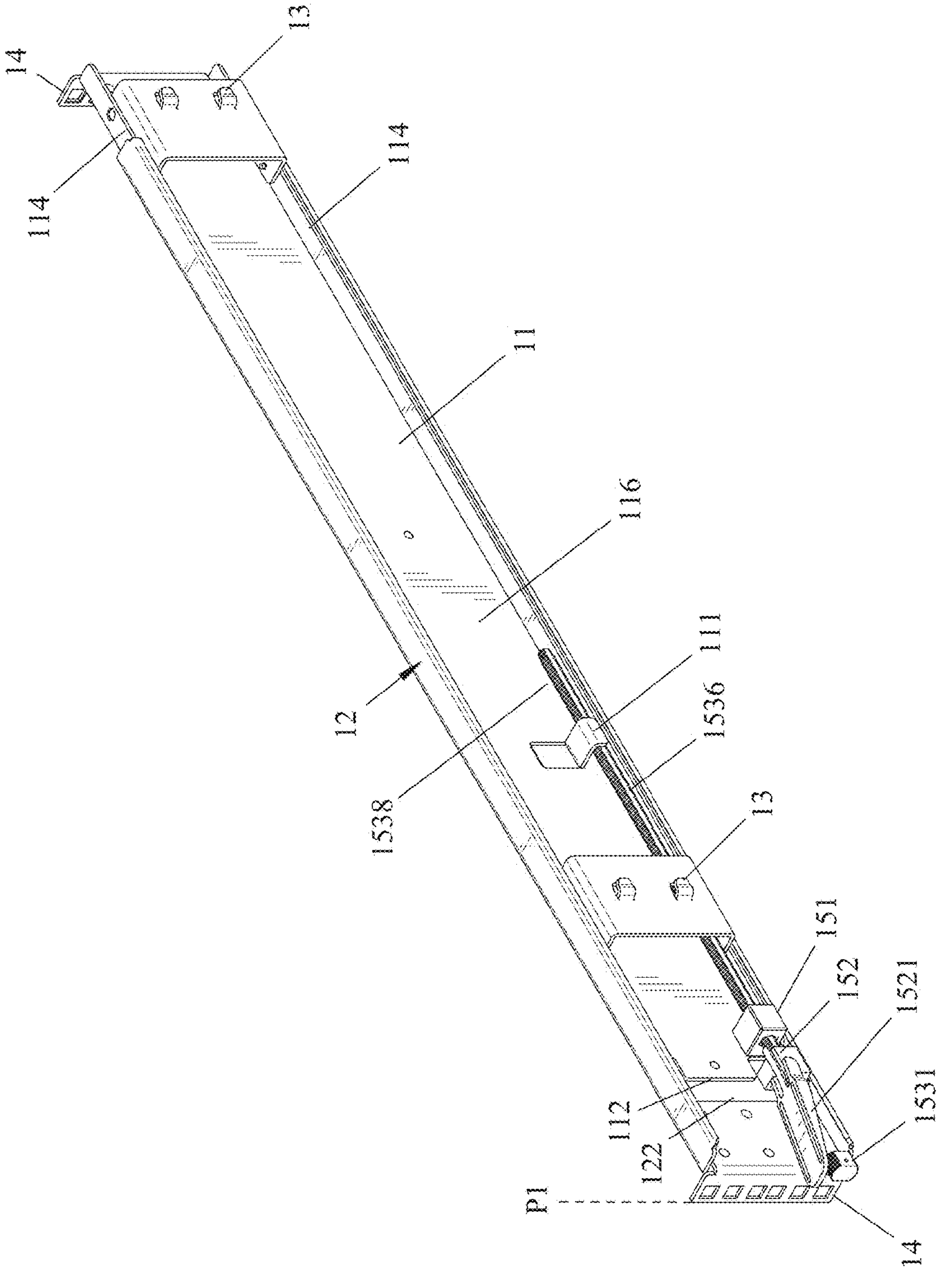
FIG. 14 is a schematic diagram showing the adjustment member of the present invention driving the front bracket to be in a folded position relative to the adapter plate.
Figure 15:
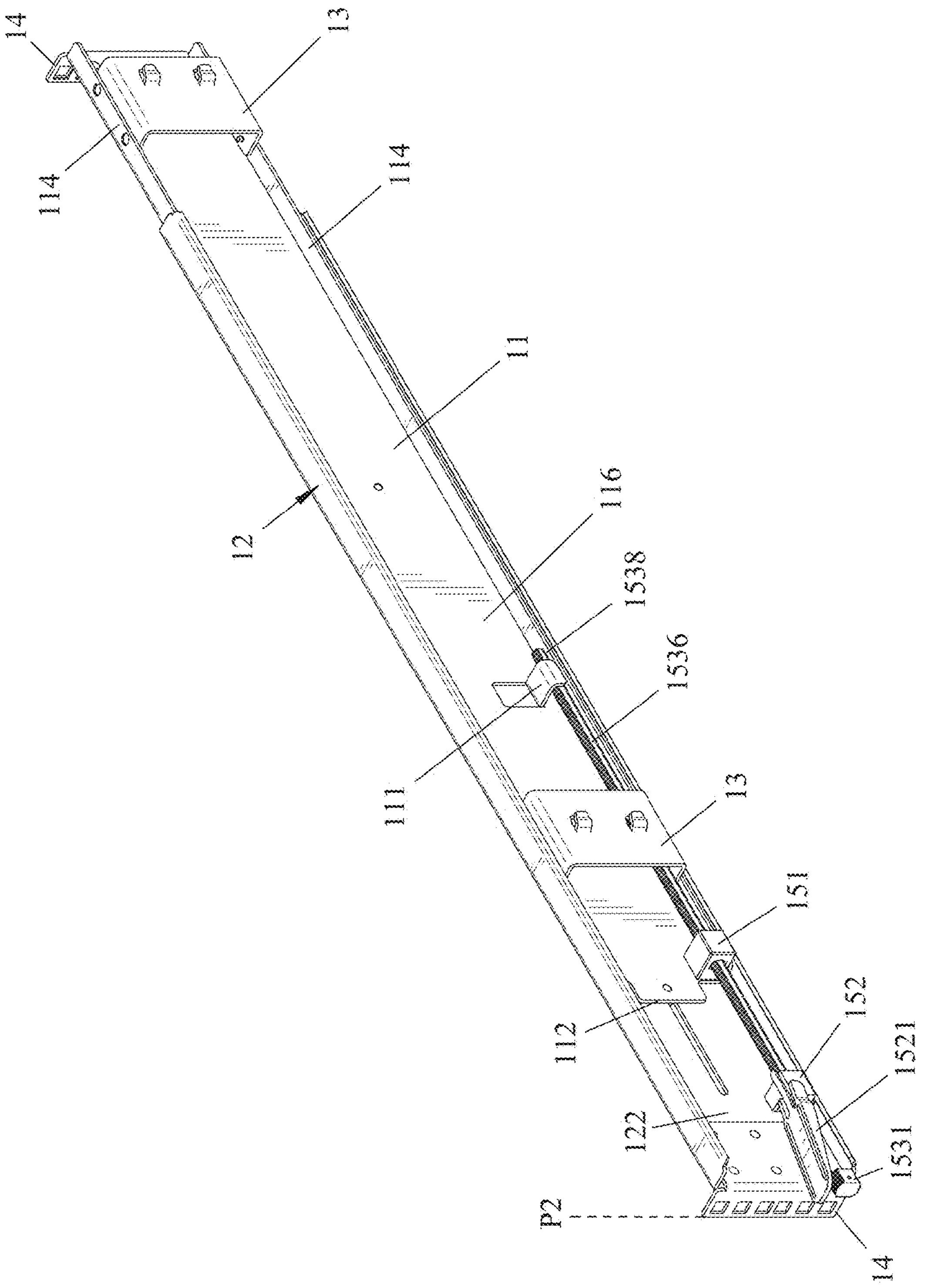
FIG. 15 is a schematic diagram showing the adjustment member of the present invention driving the front bracket to be located at a predetermined position relative to the adapter plate.
Figure 16:
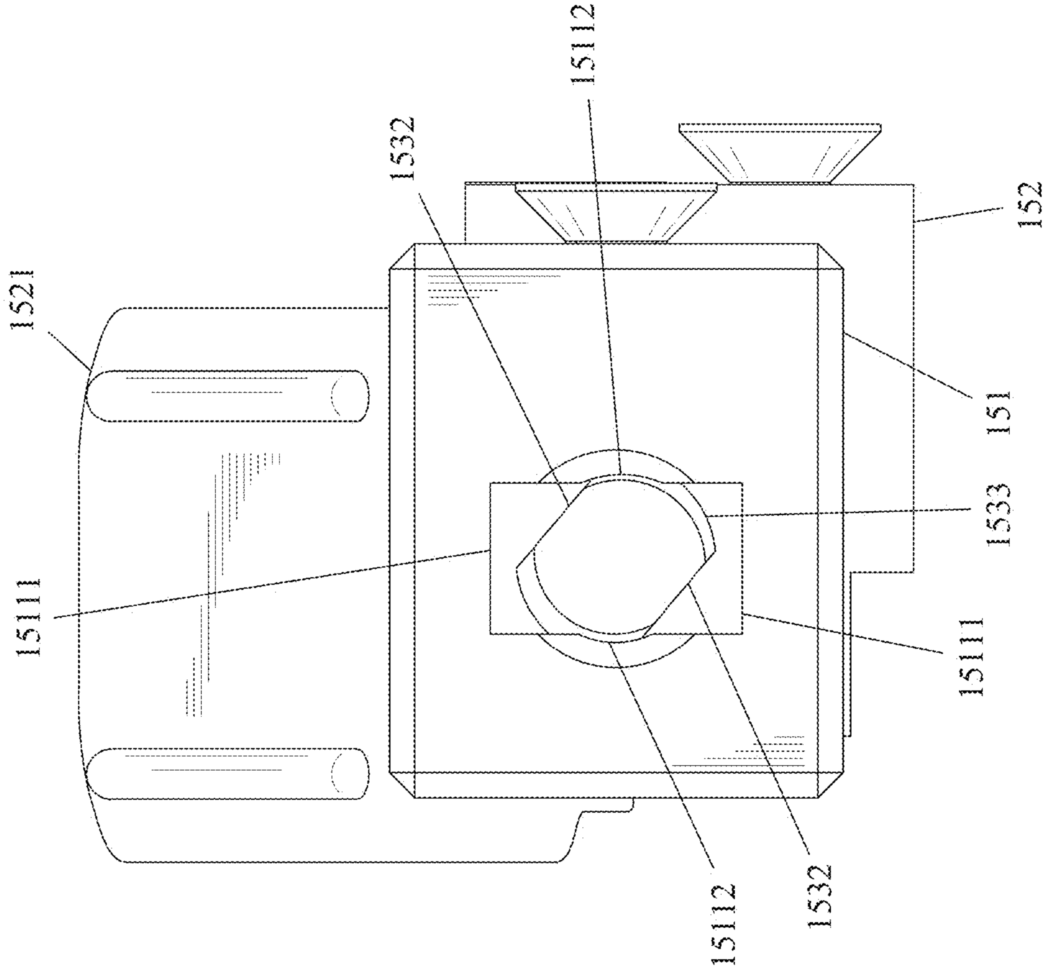
FIG. 16 is a schematic diagram of the operating portion of the present invention rotating to drive the adjustment member to fine-tune the forward and backward displacement within the locking member.
Figure 17:
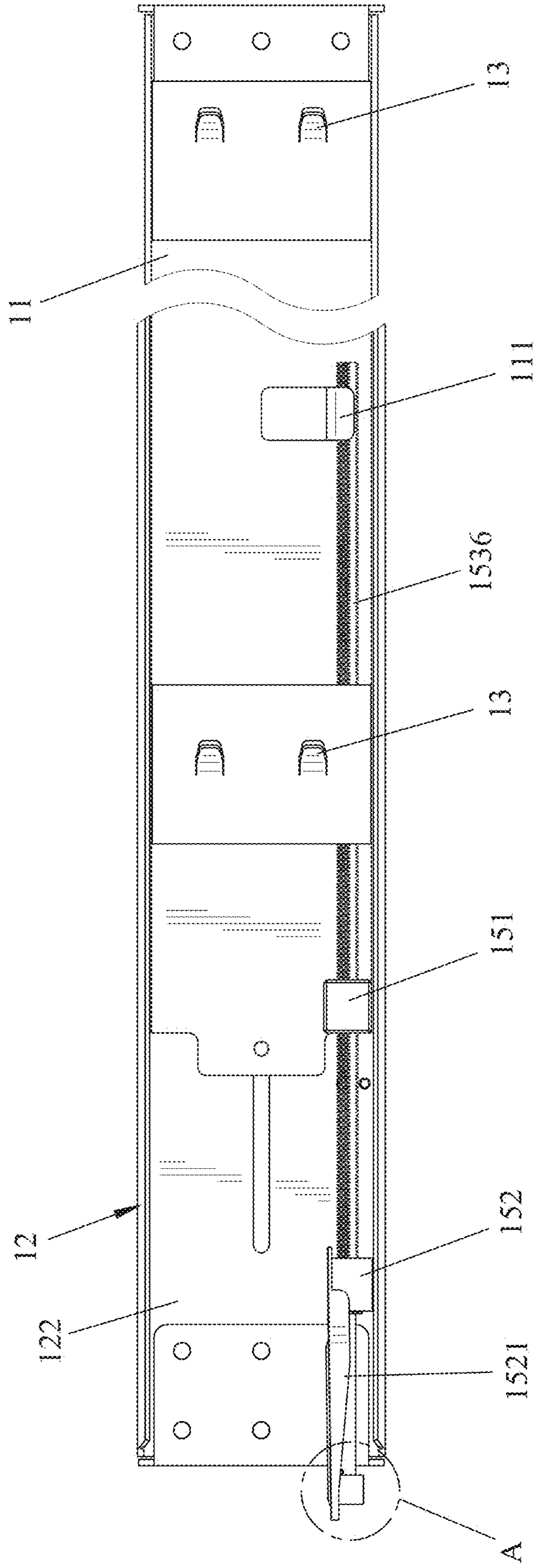
FIG. 17 is a schematic diagram showing the cap covering the operating portion according to the present invention.
Figure 18:
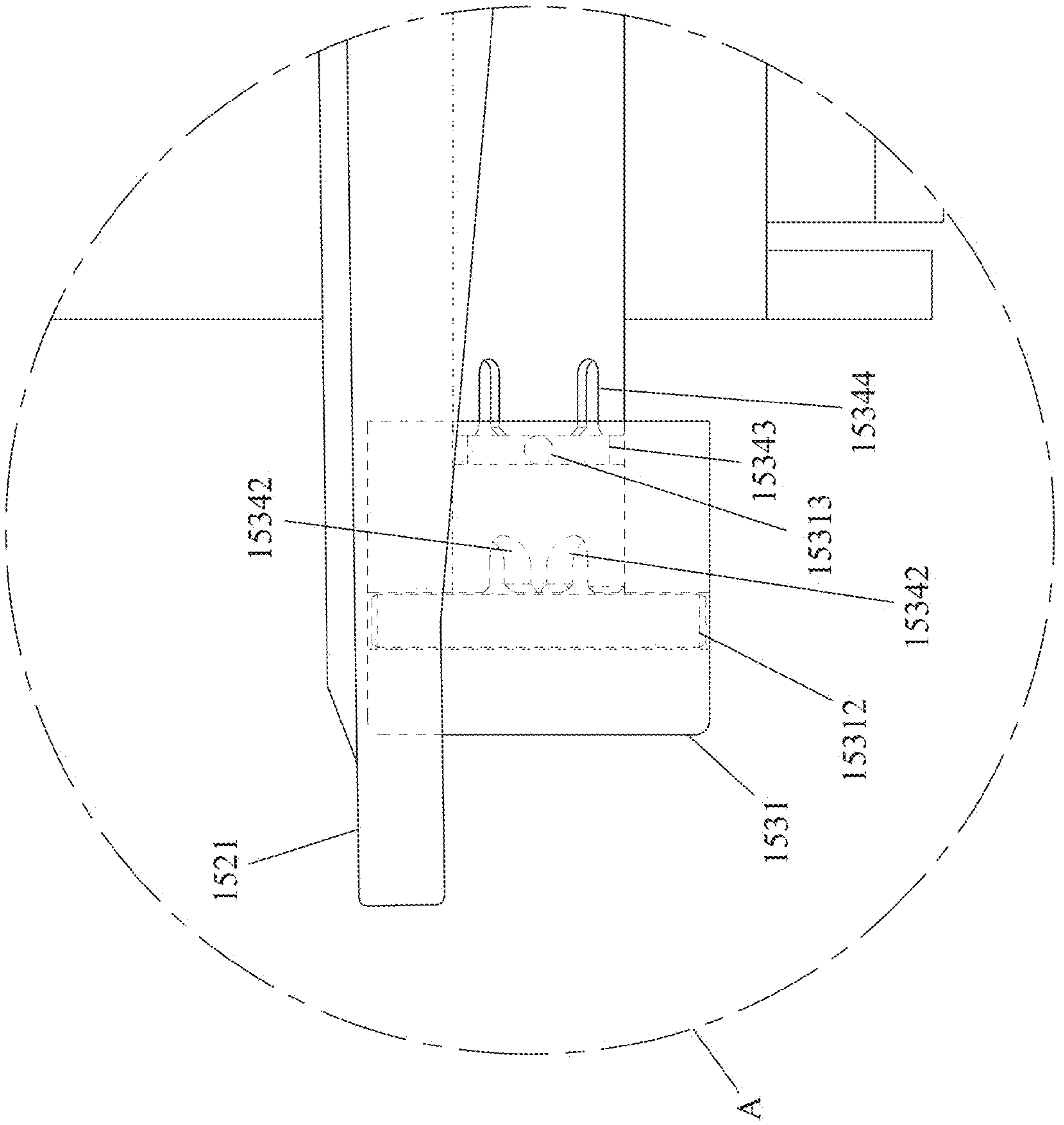
FIG. 18 is a schematic diagram showing that the operating portion of the present invention is unable to rotate and drive the adjustment member.

Please refer to FIG. 10 and FIG. 11 again, where when the operating portion 1531 is in the first state S1 relative to the joint portion 1534, the operating portion 1531 applies force relative to the joint portion 1534 to rotate, and the locking portion 15313 is located in the first engaging groove 15343 and rotates. When the first state S1 is switched to the second state S2, a force is applied to the operating portion 1531 to press toward the joint portion 1534, the elastic member 154 is elastically deformed, the spring pin 15312 enters the recessed groove 15342, and the locking portion 15313 enters the second engaging groove 15344 from the first engaging groove 15343. Apply force to the operating portion 1531 again to make the spring pin 15312 abut against the recessed groove 15342 to rotate the joint portion 1534. When the operating portion 1531 switches from the second state S2 to the first state S1 relative to the joint portion 1534, the operating portion 1531 is stopped from being pressed, the elastic member 154 is elastically reset, the spring pin 15312 is disengaged from the recessed groove 15342, and the locking portion 15313 enters the first engaging groove 15343 from the second engaging groove 15344.

Through the above-mentioned actions, the overall length of the adapter plate 11 and the front bracket 12 is adjusted to adapt to the size difference of different slide rail assemblies 16 for precise positioning, which has the effect of rapid adjustment and fine adjustment.

Figure 20:
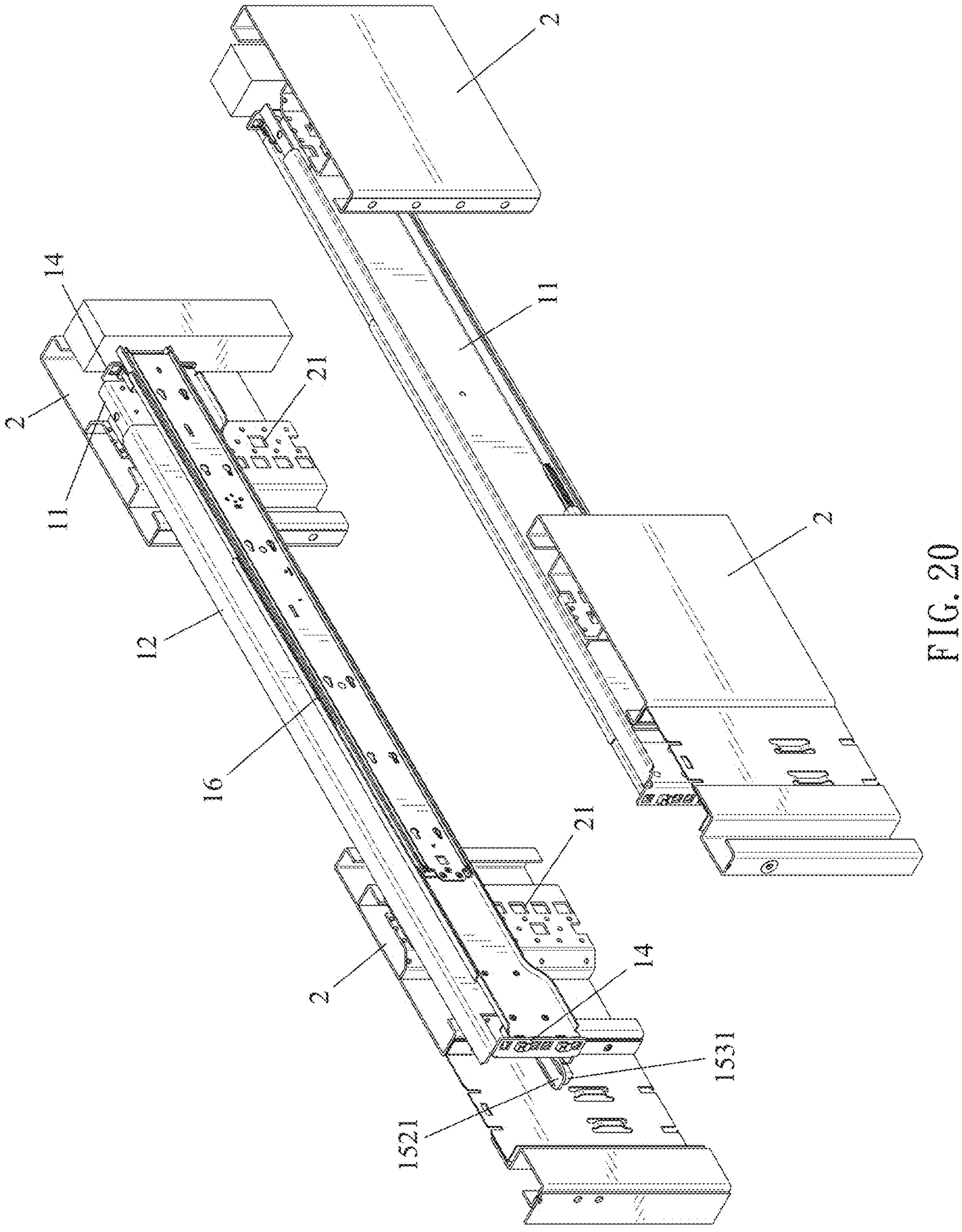
FIG. 20 is a schematic diagram of the support device of the present invention connected to the slide rail assembly and installed on the preset rack.

Please refer to FIG. 1 and FIG. 20, where when both ends of the slide rail assembly 16 are disassembled from the mounting member 14 at the front bracket 12 and the other mounting member 14 at the adapter plate 11, except for the change of the locking state and the opening and covering of the cap, the other movement directions are opposite to the above-mentioned movements. When the adjustment member 153 drives the front bracket 12 to move relative to the adapter plate 11 to the folded position P1, the adjustment member 153 forms an extension section 1538 away from one end 1535 of the locking member 151. The extension section 1538 is located between the inner edge surface 116 of adapter plate 11, the bent portion 111 and the adjacent bent sections 114 to form a limit.

What the invention claimed is:

1. A support device, comprising:

an adapter plate having a first end and a second end;

a front bracket covering one side of said first end of said adapter plate and displaceable relative to said adapter plate; and an adjustment mechanism comprising a locking member disposed at said first end of said adapter plate, a supporting member disposed at a front end of said front bracket and an adjustment member passed through said supporting member to form a pivot connection and then passed through said locking member, said adjustment member comprising an operating portion located at one end thereof and far from said locking member and protruding out of said front bracket, said operating portion being operable for said adjustment member to drive said front bracket to adjust the displacement relative to said adapter plate;

wherein said adjustment member further comprises a flat surface located on each of a first two opposite sides of an opposite end thereof opposite to said operating portion relative to said supporting member, and a second guide portion with an arc convex shape located on each of a second two opposite sides of the said opposite end thereof opposite to said operating portion relative to said supporting member; said locking member comprises a through hole, two through hole grooves with an arc concave shape respectively located on a first two opposite sides in said through hole in the vertical direction, and two first guide portions respectively located on a second two opposite sides in said through hole in the horizontal direction; said operating portion is forced to rotate, when said second guide portions are butted against said first guide portions, said through hole grooves are aligned with said flat surfaces, and said adjustment member is driven to fine-tune the forward and backward displacement in said locking member through the rotation of said operating portion, and when said first guide portions are aligned with said flat surfaces and said second guide portions are aligned with said through hole grooves, said operating portion drives said adjustment member to quickly move and adjust.

2. The support device as claimed in claim 1, wherein said supporting member has a cap assembled on a top thereof, said cap being operable to open or cover said operating portion so that said operating portion is prohibited from being operated when said cap covers said operating portion.

3. The support device as claimed in claim 1, wherein said first guide portions and said second guide portions are a thread structure that matches each other.

4. The support device as claimed in claim 1, wherein said adapter plate comprises a bent portion protruded on an inner edge surface thereof, and two bent sections extending inward on opposing upper and lower sides thereof, so that when said adjustment member drives said front bracket to move relative to said adapter plate to a folded position, said adjustment member has one end thereof form an extension section away from said locking member, and said extension section is located between said inner edge surface of said adapter plate, said bent portion and said bent sections adjacent thereto to form a limit.

5. The support device as claimed in claim 4, wherein said adapter plate is further provided with at least one fixing member, said at least one fixing member having two ends thereof respectively connected to said two bent sections of said adapter plate and being used for installation on a preset rack.

6. The support device as claimed in claim 1, wherein said adapter plate further comprises at least one fastener; said front bracket further comprises at least one rail groove for said at least one fastener to penetrate, so that after said adjustment member drives said front bracket to move relative to said adapter plate, said at least one fastener is forced to lock, so that said front bracket is locked relative to said adapter plate.

7. The support device as claimed in claim 1, further comprising a first mounting member mounted at said second end of said adapter plate, and a second mounting member mounted at said front bracket far away from said first end of said adapter plate and connected to another mounting member, said first mounting member and said second mounting member being used to assemble a preset slide rail assembly.

8. The support device as claimed in claim 1, wherein said adjustment member comprises a joint portion located at one end thereof away from said supporting member and assembled with said operating portion, said joint portion being provided with a second receiving groove, a recessed groove, a first engaging groove and a second engaging groove, said second receiving groove being recessed in an end surface of said adjustment member away from said supporting member, said recessed groove extending from said end surface of said adjustment member toward said supporting member, said first engaging groove being located on said recessed groove toward one side of said supporting member, said first engaging groove surrounding and being recessed on a surface of one end of said adjustment member, said second engaging groove extending from said first engaging groove toward said supporting member; said operating portion is provided with a first receiving groove, a spring pin and a locking portion, said first receiving groove being recessed in said operating portion, said locking portion being convexly disposed on a surface of said first receiving groove, said spring pin being tightly arranged in said operating portion; said adjustment mechanism further comprises an elastic member, said elastic member having two opposite ends thereof placed in said first receiving groove and said second receiving groove respectively.

9. The support device as claimed in claim 8, wherein when said operating portion is in a first state relative to said joint portion, said operating portion applies force to rotate relative to said joint portion, and said locking portion is located in said first engaging groove and rotates flexibly; when said first state is switched to a second state, a force is applied to said operating portion to press said joint portion, at this time, said elastic member is elastically deformed, said spring pin enters said recessed groove, and said locking portion enters said second engaging groove from said first engaging groove, and a force is applied to said operating portion again, so that said spring pin abuts against said recessed groove to rotate said joint portion, and said adjustment member is fine-tuned in the forward and backward displacement in said locking member; when said operating portion stops pressing toward said joint portion to return to said first state, said elastic member is elastically reset, said spring pin is disengaged from said recessed groove, and said locking portion enters said first engaging groove from said second engaging groove.

* * * * *